(12) United States Patent
Krauth

(10) Patent No.: US 6,835,503 B2
(45) Date of Patent: Dec. 28, 2004

(54) USE OF A PLANARIZING LAYER TO IMPROVE MULTILAYER PERFORMANCE IN EXTREME ULTRA-VIOLET MASKS

(75) Inventor: Anthony C. Krauth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 182 days.

(21) Appl. No.: 10/122,031

(22) Filed: Apr. 12, 2002

(65) Prior Publication Data

US 2003/0194615 A1 Oct. 16, 2003

(51) Int. Cl.[7] .................................................. G03F 9/00
(52) U.S. Cl. ..................... 430/5; 359/838; 427/162; 428/143
(58) Field of Search ............... 430/5; 427/162–169; 359/838; 205/71, 116; 428/143, 687

(56) References Cited

U.S. PATENT DOCUMENTS

| | | | |
|---|---|---|---|
| 5,122,388 A | * | 6/1992 | Hashimoto et al. ......... 427/498 |
| 5,958,629 A | | 9/1999 | Yan et al. |
| 6,002,740 A | | 12/1999 | Cerrina et al. |
| 6,011,646 A | | 1/2000 | Mirkarimi et al. |
| 6,048,652 A | | 4/2000 | Nguyen et al. |
| 6,134,049 A | | 10/2000 | Spiller et al. |
| 6,159,643 A | | 12/2000 | Levinson et al. |
| 6,228,512 B1 | | 5/2001 | Bajt et al. |
| 6,387,572 B1 | * | 5/2002 | Tong et al. ..................... 430/5 |
| 6,610,447 B2 | * | 8/2003 | Yan et al. ...................... 430/5 |
| 2004/0063004 A1 | * | 4/2004 | Alkemper et al. ............. 430/5 |

* cited by examiner

Primary Examiner—Mark F. Huff
Assistant Examiner—Kripa Sagar
(74) Attorney, Agent, or Firm—TraskBritt

(57) ABSTRACT

The present invention relates to fabricating a reticle or mask for use in an extreme ultraviolet ("EUV") photolithographic process. The EUV reticle comprises a substrate, a planarizing layer formed over a surface of the substrate, and a reflective layer deposited in contact with the planarizing layer. The planarizing layer comprises a material that has superior surface flatness properties and provides a flat surface upon which the reflective layer is deposited. The planarizing layer is spin-coated onto the substrate and comprises a material such as an anti-reflective material, a dielectric material, or a polymer. Since the reflective layer is deposited over the flat surface provided by the planarizing layer, the reflective layer is not compromised by defects in the surface of the substrate.

35 Claims, 1 Drawing Sheet

USE OF A PLANARIZING LAYER TO IMPROVE MULTILAYER PERFORMANCE IN EXTREME ULTRA-VIOLET MASKS

BACKGROUND OF THE INVENTION

1. Field of the Invention

The present invention relates generally to a reticle or mask used in a lithography process and, more particularly, to fabricating a reticle or mask for use in an extreme ultraviolet lithography process.

2. State of the Art

Lithography processes are commonly used to create features on a semiconductor wafer by transferring a pattern or image from a reticle or mask. The reticle, which contains the pattern to be transferred, is placed over the semiconductor wafer and light from a light source is transmitted through the reticle. For example, in extreme ultraviolet ("EUV") lithography, light is reflected off the reticle and projected through a series of mirrors onto the semiconductor wafer. The pattern on the reticle creates an image that is reduced in size and transferred to a photoresist layer covering the semiconductor wafer. The resist is then developed and the semiconductor wafer is etched and processed further to form the semiconductor device having the desired circuit pattern.

The wavelength of light transmitted through, or reflected by, the reticle determines the size of the features to be created on the semiconductor device. Generally, light of a shorter wavelength is used to more precisely and accurately create small features. For example, deep ultraviolet radiation is used to create semiconductor devices at 0.15 $\mu$m, but for semiconductor devices at 0.05 $\mu$m or lower, EUV radiation is used.

In EUV lithography, EUV radiation is directed from a light source onto an EUV reticle through a series of mirrors. The EUV radiation comprises light at a wavelength of approximately 3–50 nm. The EUV reticle comprises a substrate and multiple, reflective layers that are supported on the substrate. On top of the reflective layers is an absorbing layer that is patterned with a circuit design that absorbs some of the EUV radiation. The remaining EUV radiation is reflected by the reflective layers, through a series of aspheric mirrors, to produce a desired pattern on the semiconductor wafer. Since the reticle includes reflective layers, EUV radiation is not transmitted through the substrate. Rather, the EUV radiation is reflected by the reticle.

In order to achieve the desired accuracy and precision of EUV lithography, a surface of the substrate of the EUV reticle must be optically flat or free of defects. If the substrate surface is not flat, the defects may be propagated into the reflective layers and ultimately transferred to the photoresist layer of the semiconductor wafer. In other words, these defects may substantially degrade the image fidelity produced by the reflective layers. Defects on the substrate cause local perturbations in the reflective layers that will generate a phase difference in the light that is reflected at that point. The out-of-phase light will interfere destructively with the surrounding light and alter the desired image. The flatness of the substrate is measured by peak-to-valley flatness of the substrate surface topography. Currently, substrates exhibiting a 200–400 nm (2000–4000 Å) peak-to-valley surface flatness are available from manufacturers in EUV reticles. However, it would be desirable to use substrates having 50 nm (500 Å) or less peak-to-valley surface flatness to achieve the necessary performance. While 50 nm (500 Å) peak-to-valley surface flatness has been achieved for optics, this degree of flatness requires additional, expensive fabrication steps, such as abrasive polishing. These abrasive polishing steps may include chemical mechanical polishing ("CMP") or lapping techniques.

In addition to surface flatness, the substrate must also have a low coefficient of thermal expansion ("CTE"). If the substrate has a high CTE, heat produced by the EUV radiation and conducted to the substrate may cause the substrate to expand, thereby increasing the size of the reticle and features thereof as well as potentially causing distortion. Such changes to the reticle may affect the accuracy and precision of the image to be patterned onto the semiconductor wafer.

An optimal substrate would have a high degree of surface flatness, in order to achieve the desired reflectivity of the reflective layers, and a low CTE, in order to minimize expansion of the substrate. However, an inverse relationship exists between the surface flatness and thermal expansion properties of commonly used substrates. For example, silicon is commonly used as a substrate in EUV reticles because of its easily obtainable surface flatness characteristics. However, silicon has a relatively high CTE (2.5 ppm/° C.). Other substrates commonly used in EUV reticles include ultra-low expansion materials, such as ULE™ glass or ZERODUR™ glass ceramic. While ULE™ glass has a low CTE (0.02 ppm/° C.), it has a high number of scratches or defects on its surface and, therefore, is not flat.

Since no single substrate has a high degree of surface flatness and a low CTE, various solutions have been proposed to achieve the desired combination of surface flatness and CTE. In U.S. Pat. No. 6,048,652 to Nguyen et al., a reticle blank with a high degree of reflectivity and a low CTE is purportedly disclosed. The reticle blank comprises a reflective layer formed over a flat, silicon substrate. A layer of low thermal expansion material is then formed on the reflective layer to ensure that the reticle blank will have a low CTE. The flat substrate is subsequently removed, leaving the reflective layer overlying the low thermal expansion material.

In U.S. Pat. No. 6,159,643 to Levinson et al., a two-layer substrate is disclosed. A top layer of the substrate comprises silicon exhibiting the optical flatness suitable for EUV lithography. A bottom layer of the substrate comprises a low expansion glass, ceramic, or metal and has a CTE of less than 1.0 ppm/° C.

In U.S. Pat. No. 6,011,646 to Mirkarimi et al., a method of reducing stress between a reflective, multilayer film and an optic or substrate is disclosed. A buffer layer is disposed between the multilayer film and the optic or substrate to counteract the stress in the multilayer film. The buffer layer, is asserted to prevent the stress from deforming the optic and is comprised of Mo/Si, Mo/Be, Mo$_2$C/Si, Mo$_2$C/Be, amorphous silicon, or amorphous carbon. The buffer layer is used in the optics of EUV lithography systems. A purported improvement to Mirkarimi et al. is disclosed in U.S. Pat. No. 6,134,049 to Spiller et al. The Spiller et al. method includes reducing the thickness of the total film by incorporating a stress-reducing layer system into the reflective, multilayer film.

In addition to the solutions discussed above, a substrate with a low CTE may also be smoothed by CMP techniques. However, CMP is expensive and increases the number of steps required to fabricate the reticle. Therefore, what is needed in the art is a less expensive method of achieving a sufficiently flat-surfaced substrate that may be used in an EUV reticle.

BRIEF SUMMARY OF THE INVENTION

The present invention relates to the fabrication of a reticle or mask for use in an EUV photolithographic process. The method of fabricating the reticle comprises providing a substrate, forming a planarizing layer over the substrate, and depositing a reflective layer in contact with the planarizing layer. As used herein, the singular term "reflective layer" includes and encompasses multiple reflective layers as employed in the art. The substrate is a low thermal expansion material that has a coefficient of thermal expansion of less than approximately 0.1 ppm/° C., such as a low thermal expansion glass or ceramic. The planarizing layer is formed by spin-coating an anti-reflective material, a dielectric material, or a polymer onto a surface of the substrate. The planarizing layer exhibits a peak-to-valley surface flatness of approximately 20 Å, thereby providing a flat surface upon which the reflective layer may be deposited.

A reticle for use in an EUV photolithographic process is also disclosed. The reticle comprises a substrate and a planarizing layer in contact with the substrate. The substrate comprises a material with a coefficient of thermal expansion of less than approximately 0.1 ppm/° C., such as a low thermal expansion glass or glass ceramic. The planarizing layer comprises an anti-reflective material, a dielectric material, or a polymer that is spin-coated onto a surface of the substrate. The reticle also comprises a reflective layer, which in actuality may comprise multiple layers as noted above, in contact with the planarizing layer. The planarizing layer exhibits a peak-to-valley surface flatness of approximately 20 Å and provides a flat surface upon which the reflective layer may be deposited.

DESCRIPTION OF THE DRAWING

By way of example, particular embodiments of the invention will be described with reference to the accompanying drawing, in which.

DETAILED DESCRIPTION OF THE INVENTION

Figure 1:
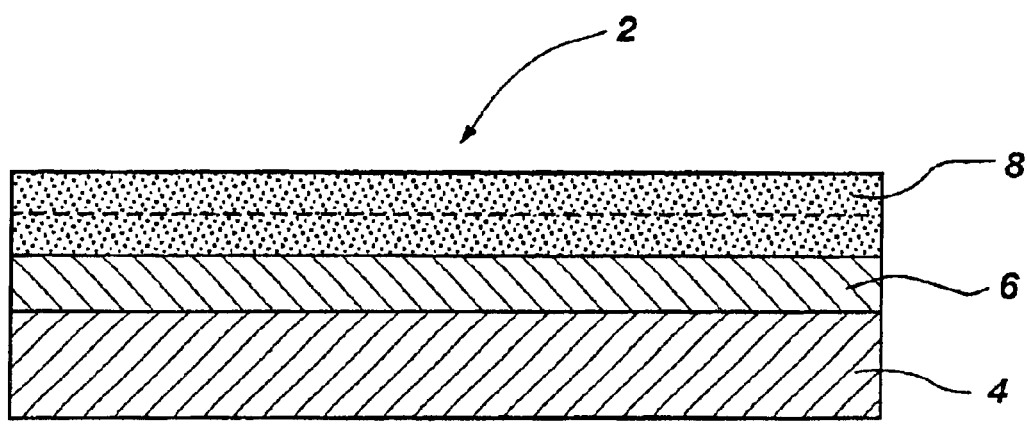
FIG. 1 shows an EUV reticle of the present invention.

The present invention relates to the fabrication and use of a reticle or mask in an EUV lithography process. To achieve the desired surface flatness of a substrate, a planarizing layer is formed on the substrate. Ideally, the planarizing layer makes a surface of the substrate having raised surface perturbations or cupped lower areas into a planar surface. The planarizing layer changes the topography of the substrate from nonplanar to, ideally, perfectly planar. The planarizing layer is formed over, or in contact with, a surface of the substrate. The planarizing layer provides a flat surface upon which a reflective layer may be formed. By using the planarizing layer to cover and smooth surface defects in the substrate, the defects do not affect the reflectivity of the overlying reflective layer and are not propagated to the semiconductor wafer. The planarizing layer may remain a part of the reticle because the EUV radiation is not transmitted through the reticle. Therefore, the planarizing layer does not have to be removed from the reticle before patterning.

As shown in FIG. 1 the EUV reticle 2 comprises, in ascending order, a substrate 4, a planarizing layer 6, and a reflective layer 8. Even though reflective layer 8 is shown as a single layer for the sake of clarity of description, reflective layers actually a multilayer structure, as known in the art. Reflective layer 8 comprises more than one layer, which is represented by the dashed line in FIG. 1 For example, reflective layers 8 comprises multiple layers of Mo/Si or Mo/Be, with individual layers of the reflective layer 8 alternating between Mo and Si or Be. The individual layers may exhibit substantial differences in their refractive indices, with reflective layer 8 comprising a low refractive index layer and a high refractive index layer. For example, a transition metal element exhibiting a high melting point may be used for the low refractive index layer while a semiconductor material may be used for the high refractive index layer. The individual layers of reflective layer 8 tray be formed by sputtering, such as sputtering in a dual-source RF or DC magnetron sputtering system, ion-beam sputtering, or other sputtering techniques known in the art. In addition, conventional deposition or formation techniques known in the art may be used, including, but not limited to, chemical vapor deposition ("CVD").

The substrate 4 provides physical support to the EUV reticle 2, upon which the remaining layers are formed. In addition, the substrate 4 may provide surface flatness and low thermal expansion characteristics. While the substrate 4 may be comprised of silicon, the substrate 4 may also comprise a material with a CTE of approximately 1.0 ppm/° C. or less. It is desirable that the substrate comprises a material with a CTE of approximately 0.5 ppm/° C. or less. More desirably, the substrate 4 comprises a material with a CTE of approximately 0.1 ppm/° C. or less. It is also desirable that the substrate 4 is an ultra-low thermal expansion glass material, such as ULE™ glass or ZERODUR™ glass ceramic (Corning, Inc., Corning, N.Y.). The optical properties of the substrate 4 are not critical to the invention because the reflective layer 8 reflects the EUV radiation before it reaches the substrate 4.

The planarizing layer 6 may be formed over the substrate 4 and, therefore, is positioned between the substrate 4 and the reflective layer 8. The planarizing layer 6, may comprise a material known in the art that provides superior surface flatness and has low thermal expansion characteristics, such as an anti-reflective material, dielectric material, or polymer. Preferably, the planarizing layer 6 is spin-coated onto the substrate 4, which requires that the material of the planarizing layer be suspended or dissolved in a solvent to facilitate deposition on the substrate 4. The solvent is then evaporated away via a hotplate or like source. Depending on the choice of material and solvent, the desired surface flatness of the planarizing layer may be readily achieved. The planarizing layer 6 may also be formed by CVD or physical vapor deposition ("PVD"). However, these techniques are less preferable because they require subsequent planarization steps. In addition, these techniques deposit the material conformally, which may propagate any defects in the substrate 4 into the planarizing layer 6.

The anti-reflective material used in the present invention may comprise a material known in the art, such as an inorganic or organic anti-reflective material. Suitable inorganic materials may include, but are not limited to, titanium, titanium nitride, titanium dioxide, titanium oxynitride, inorganic polymers, chromium oxide, amorphous carbon, amorphous silicon, and titanium tungsten. Suitable organic materials may include organic resins or polymers that optionally include light-absorbing dyes. For example, DUV42, XHRIC, or AB3, which are available from Brewer Science (Rolla, Mo., are anti-reflective materials that may be used as the planarizing layer 6. AR19, which is available from Shipley Company (Marlborough, Mass.), is also an anti-reflective material that may be used as the planarizing layer 6. Spin-on dielectric materials that may be used in the present invention include, but are not limited to, spin-on glasses (such as silicates or siloxanes) or organic spin-on polymer dielectrics. For example, DU0248 available from Honeywell Electronic Materials (Morristown, N.J.) or SF1014 available from Sumitomo Chemical (Osaka, Japan) may be used as the dielectric material. Polymers that may be used as the planarizing layer include polymers that may be used in etch-back processes including, but not limited to, XP2766 available from Shipley Company (Marlborough, Mass.). In addition, IX370G available from JSR Corp. (Japan) may be used as the planarizing layer.

Furthermore, the material of the planarizing layer 6 is preferably formulated to withstand subsequent reticle processing. It is also desirable that the planarizing layer 6 may have a peak-to-valley surface flatness of less than 20 Å and, preferably, less than 10 Å. The polymer XP2766 provides the desired peak-to-valley surface flatness of less than 20 Å while both DUV42 and AB3 provide the desired peak-to-valley surface flatness of 10 Å. The optical properties of the planarizing layer 6 are not critical to the invention because the overlying reflective layer 8 reflects the EUV radiation before it reaches the planarizing layer.

The thickness of the planarizing layer 6 is not critical because the reflective layer 8 reflects the EUV radiation before it passes through other layers of the EUV reticle 2. However, the thickness of the planarizing layer 6 may be affected by the number of defects in the surface of the substrate 4. If the substrate 4 is substantially free of surface defects, the planarizing layer 6 may be formed as a thin film. However, if the substrate 4 has numerous surface defects, the planarizing layer 6 may be formed to a sufficient thickness to cure or remedy the surface defects by covering them with the flat-surfaced planarizing layer 6. Preferably, the planarizing layer 6 ranges in thickness from approximately 1,000 Å–10,000 Å. For example, the planarizing layer 6 may be spin-coated to a thickness that covers or fills in scratches or other defects in the substrate 4. It is contemplated that the planarizing layer 6 may be approximately 1000 Å thick.

In one embodiment, the planarizing layer 6 is formed by spin-coating an anti-reflective material onto a surface of an ultra-low thermal expansion glass substrate, such as ULE™ substrate 4. The anti-reflective material is baked to form the planarizing layer 6 over, or in contact with, the ULE™ substrate 4. The reflective layer 8 is then deposited over the planarizing layer 6 to produce the EUV reticle 2. The reflective layer 8 comprises Mo/Be or Mo/Si multilayers, as is known in the art. The resulting EUV reticle 2 has a peak-to-valley surface flatness of approximately 2–2.5nm (20–25 Å). This degree of surface flatness is a significant improvement over the 200–400 nm (2000–4000 Å) peak-to-valley surface flatness currently available from manufacturers and is greatly improved over the prior standard of desired peak-to-valley flatness of 50 nm (500 Å).

Forming the planarizing layer 6 between the substrate 4 and reflective layer 8 achieves a drastically improved level of effective substrate surface flatness. Since this level of surface flatness is achieved without using physical smoothing techniques, such as abrasive planarization or lapping, the EUV reticle 2 of the present invention is less expensive to fabricate than other EUV reticles. Furthermore, the overall capital and operating cost of an EUV scanner that uses the EUV reticle 2 is reduced because the cost of the EUV reticle 2 is reduced.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating a reticle for use in an EUV photolithographic process, the method comprising:
   providing a low thermal expansion material;
   forming a planarizing layer comprising a material that is anti-reflective and has a low thermal expansion in contact with a surface of the low thermal expansion material; and
   depositing at least one reflective layer in contact with the planarizing layer.

2. The method of claim 1, wherein providing a low thermal expansion material comprises providing a low thermal expansion glass or low thermal expansion glass ceramic.

3. The method of claim 1, wherein providing a low thermal expansion material comprises providing a material with a coefficient of thermal expansion of less than approximately 1.0 ppm/° C.

4. The method of claim 1, wherein providing a low thermal expansion material comprises providing a material with a coefficient of thermal expansion of less than approximately 0.5 ppm/° C.

5. The method of claim 1, wherein providing a low thermal expansion material comprises providing a material with a coefficient of thermal expansion of less than approximately 0.1 ppm/° C.

6. The method of claim 1, wherein forming a planarizing layer comprising a material that is anti-reflective and has a low thermal expansion in contact with a surface of the low thermal expansion material comprises one of spin-coating the planarizing layer, depositing the planarizing layer by chemical vapor deposition, or depositing the planarizing layer by physical vapor deposition.

7. The method of claim 1, wherein forming a planarizing layer comprising a material that is anti-reflective and has a low thermal expansion in contact with a surface of the low thermal expansion material comprises spin-coating the planarizing layer to a thickness of approximately 1000 Å.

8. The method of claim 1, wherein forming a planarizing layer comprising a material that is anti-reflective and has a low thermal expansion in contact with a surface of the low thermal expansion material comprises spin-coating the planarizing layer to a sufficient thickness to cover defects in a surface of the low thermal expansion material.

9. The method of claim 1, wherein forming a planarizing layer comprising a material that is anti-reflective and has a low thermal expansion in contact with a surface of the low thermal expansion material comprises forming the planarizing layer with a peak-to-valley surface flatness of less than approximately 20 Å.

10. The method of claim 1, wherein forming a planarizing layer comprising a material that is anti-reflective and has a low thermal expansion in contact with a surface of the low thermal expansion material comprises forming the planarizing layer with a peak-to-valley surface flatness of less than approximately 10 Å.

11. The method of claim 1, wherein forming a planarizing layer comprising a material that is anti-reflective and has a low thermal expansion in contact with a surface of the low thermal expansion material comprises forming the planarizing layer with a peak-to-valley surface flatness of less than approximately 50 Å.

12. A method of fabricating a reticle for use in an EUV photolithographic process, the method comprising:
providing an ultra-low thermal expansion glass having a coefficient of thermal expansion of less than approximately 0.1 ppm/° C.;
spin-coating a layer of material that is anti-reflective and has a low thermal expansion over the ultra-low thermal expansion glass, wherein the layer of material that is anti-reflective and has a low thermal expansion has a peak-to-valley surface flatness of approximately 20 Å; and
depositing at least one reflective layer in contact with the layer of material that is anti-reflective and has a low thermal expansion.

13. The method of claim 12, wherein spin-coating a layer of material that is anti-reflective and has a low thermal expansion over the ultra-low thermal expansion glass comprises spin-coating the layer of material that is anti-reflective and has a low thermal expansion to a sufficient thickness to cover defects in a surface of the ultra-low thermal expansion glass.

14. The method of claim 12, wherein spin-coating a layer of material that is anti-reflective and has a low thermal expansion over the ultra-low thermal expansion glass comprises spin-coating the layer of material that is anti-reflective and has a low thermal expansion to a thickness of approximately 1000 Å.

15. The method of claim 12, wherein spin-coating a layer of material that is anti-reflective and has a low thermal expansion over the ultra-low thermal expansion glass comprises spin-coating the layer of material that is anti-reflective and has a low thermal expansion to a peak-to-valley surface flatness of less than approximately 20 Å.

16. The method of claim 12, wherein spin-coating a layer of material that is anti-reflective and has a low thermal expansion over the ultra-low thermal expansion glass comprises spin-coating the layer of material that is anti-reflective and has a low thermal expansion to a peak-to-valley surface flatness of less than approximately 10 Å.

17. A reticle for use in an EUV photolithographic process comprising:
a substrate;
a planarizing layer in contact with a surface of the substrate, wherein the planarizing layer comprises a material that is anti-reflective and has a low thermal expansion; and
at least one reflective layer in contact with the planarizing layer.

18. The reticle of claim 17, wherein the substrate comprises a low thermal expansion material.

19. The reticle of claim 17, wherein the substrate comprises a low thermal expansion glass or low thermal expansion glass ceramic.

20. The reticle of claim 17, wherein the substrate comprises a material with a coefficient of thermal expansion of less than approximately 1.0 ppm/° C.

21. The reticle of claim 17, wherein the substrate comprises a material with a coefficient of thermal expansion of less than approximately 0.5 ppm/° C.

22. The reticle of claim 17, wherein the substrate comprises a material with a coefficient of thermal expansion of less than approximately 0.1 ppm/° C.

23. The reticle of claim 17, wherein the planarizing layer comprises a spin-coated material that is anti-reflective and has a low thermal expansion.

24. The reticle of claim 17, wherein the planarizing layer comprises a spin-coated material that is anti-reflective and has a low thermal expansion and has a thickness of approximately 1000 Å.

25. The reticle of claim 17, wherein the planarizing layer is a sufficient thickness to cover defects in the surface of the substrate.

26. The reticle of claim 17, wherein the planarizing layer has a peak-to-valley surface flatness of less than approximately 20 Å.

27. The reticle of claim 17, wherein the planarizing layer has a peak-to-valley surface flatness of less than approximately 10 Å.

28. The reticle of claim 17, wherein the planarizing layer has a peak-to-valley surface flatness of less than approximately 50 Å.

29. A reticle for use in an EUV photolithographic process comprising:
an ultra-low thermal expansion material;
a layer of material that is anti-reflective and has a low thermal expansion over a surface of the ultra-low thermal expansion material, wherein the layer of material that is anti-reflective and has a low thermal expansion has a peak-to-valley surface flatness of approximately 20 Å; and
at least one reflective layer in contact with the layer of material that is anti-reflective and has a low thermal expansion.

30. The reticle of claim 29, wherein the ultra-low thermal expansion material comprises an ultra-low thermal expansion glass or an ultra-low thermal expansion glass ceramic.

31. The reticle of claim 29, wherein the ultra-low thermal expansion material comprises a material with a coefficient of thermal expansion of less than approximately 0.1 ppm/° C.

32. The reticle of claim 29, wherein the layer of material that is anti-reflective and has a low thermal expansion is spin-coated.

33. The reticle of claim 29, wherein the layer of material that is anti-reflective and has a low thermal expansion is approximately 1000 Å thick.

34. The reticle of claim 29, wherein the layer of material that is anti-reflective and has a low thermal expansion has a peak-to-valley surface flatness of less than approximately 20 Å.

35. The reticle of claim 29, wherein the layer of material that is anti-reflective and has a low thermal expansion has a peak-to-valley surface flatness of less than approximately 10 Å.

* * * * *

UNITED STATES PATENT AND TRADEMARK OFFICE
CERTIFICATE OF CORRECTION

| | |
|---|---|
| PATENT NO. | : 6,835,503 B2 |
| APPLICATION NO. | : 10/122031 |
| DATED | : December 28, 2004 |
| INVENTOR(S) | : Anthony C. Krauth |

It is certified that error appears in the above-identified patent and that said Letters Patent is hereby corrected as shown below:

On the title page:

Item (54) Title: change "USE OF A PLANARIZING LAYER TO IMPROVE MULTILAYER PERFORMANCE IN EXTREME ULTRA-VIOLET MASKS" to --USE OF A PLANARIZING LAYER TO IMPROVE MULTILAYER PERFORMANCE IN EXTREME ULTRAVIOLET MASKS--

COLUMN 1, LINES 1-3, change "USE OF A PLANARIZING LAYER TO IMPROVE MULTILAYER PERFORMANCE IN EXTREME ULTRA-VIOLET MASKS" to --USE OF A PLANARIZING LAYER TO IMPROVE MULTILAYER PERFORMANCE IN EXTREME ULTRAVIOLET MASKS--

COLUMN 4, LINE 63, change "(Rolla, Mo.," to --(Rolla, Mo.),--

COLUMN 6, LINES 50-51, after "layer to a" change "sufficient thickness to cover defects in a surface of the low thermal expansion material." to --thickness ranging from approximately 1000 Å to approximately 10,000 Å.--

UNITED STATES PATENT AND TRADEMARK OFFICE
CERTIFICATE OF CORRECTION

PATENT NO. : 6,835,503 B2
APPLICATION NO. : 10/122031
DATED : December 28, 2004
INVENTOR(S) : Anthony C. Krauth It is certified that error appears in the above-identified patent and that said Letters Patent is hereby corrected as shown below:

COLUMN 7, LINES 21-23, change "sufficient thickness to cover defects in a surface of the ultra-low thermal expansion glass." to --thickness ranging from approximately 1000 Å to approximately 10,000 Å.--

COLUMN 8, LINES 15-16, change "is a sufficient thickness to cover defects in the surface of the substrate." to --has a thickness ranging from approximately 1000 Å to approximately 10,000 Å.--

Signed and Sealed this

Third Day of October, 2006

JON W. DUDAS
*Director of the United States Patent and Trademark Office*